United States Patent
Chang et al.

(10) Patent No.: US 12,477,790 B2
(45) Date of Patent: Nov. 18, 2025

(54) METHOD OF MANUFACTURING SEMICONDUCTOR STRUCTURE

(71) Applicant: TAIWAN SEMICONDUCTOR MANUFACTURING COMPANY LTD., Hsinchu (TW)

(72) Inventors: Che-Yuan Chang, Hsinchu (TW); Hui-Zhong Zhuang, Kaohsiung (TW); Chih-Liang Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/619,104

(22) Filed: Mar. 27, 2024

(65) Prior Publication Data
US 2024/0243168 A1 Jul. 18, 2024

Related U.S. Application Data

(62) Division of application No. 17/313,748, filed on May 6, 2021, now Pat. No. 11,973,110.

(51) Int. Cl.
*H10D 62/10* (2025.01)
*H10D 1/68* (2025.01)

(52) U.S. Cl.
CPC ............ *H10D 62/116* (2025.01); *H10D 1/68* (2025.01)

(58) Field of Classification Search
CPC ..... H01L 23/5222; H01L 28/40; H01L 28/60; H01L 21/76224; H01L 27/0805; H01L 29/0653; H01L 23/5223; H01L 29/92; H01L 23/642; H01L 27/0733; H01L 2924/00; H01L 2924/1205; G11C 11/24; H10B 12/395; H10B 12/033; H10B 43/40; H10B 10/18; H01G 4/38; H01G 4/33; H01G 4/00; Y10S 148/014; H10D 1/68; H10D 1/692; H10D 62/116; H10D 1/716; H10D 84/811; H10D 84/212; H10D 1/62
See application file for complete search history.

(56) References Cited

U.S. PATENT DOCUMENTS

| | | | | |
|---|---|---|---|---|
| 2002/0074587 | A1* | 6/2002 | Takata | H10D 1/682 257/E21.582 |
| 2003/0109100 | A1* | 6/2003 | Takata | H10D 1/682 257/E21.582 |
| 2003/0178665 | A1* | 9/2003 | Takenaka | H10D 1/692 257/E21.018 |
| 2011/0018096 | A1* | 1/2011 | Izumi | H10B 12/033 257/532 |
| 2013/0049086 | A1* | 2/2013 | Ahn | H01L 21/76224 257/296 |
| 2017/0194319 | A1* | 7/2017 | Xu | H10D 1/00 |
| 2018/0151555 | A1* | 5/2018 | Chen | H01L 21/76897 |
| 2020/0411507 | A1* | 12/2020 | An | H10B 99/22 |

* cited by examiner

*Primary Examiner* — Mark W Tornow
*Assistant Examiner* — Priya M Rampersaud
(74) *Attorney, Agent, or Firm* — WPAT LAW; Anthony King

(57) ABSTRACT

A semiconductor structure includes a substrate and a first capacitor. The substrate includes an active region. The first capacitor is over the substrate and free from overlapping the active region from a top view perspective.

20 Claims, 16 Drawing Sheets

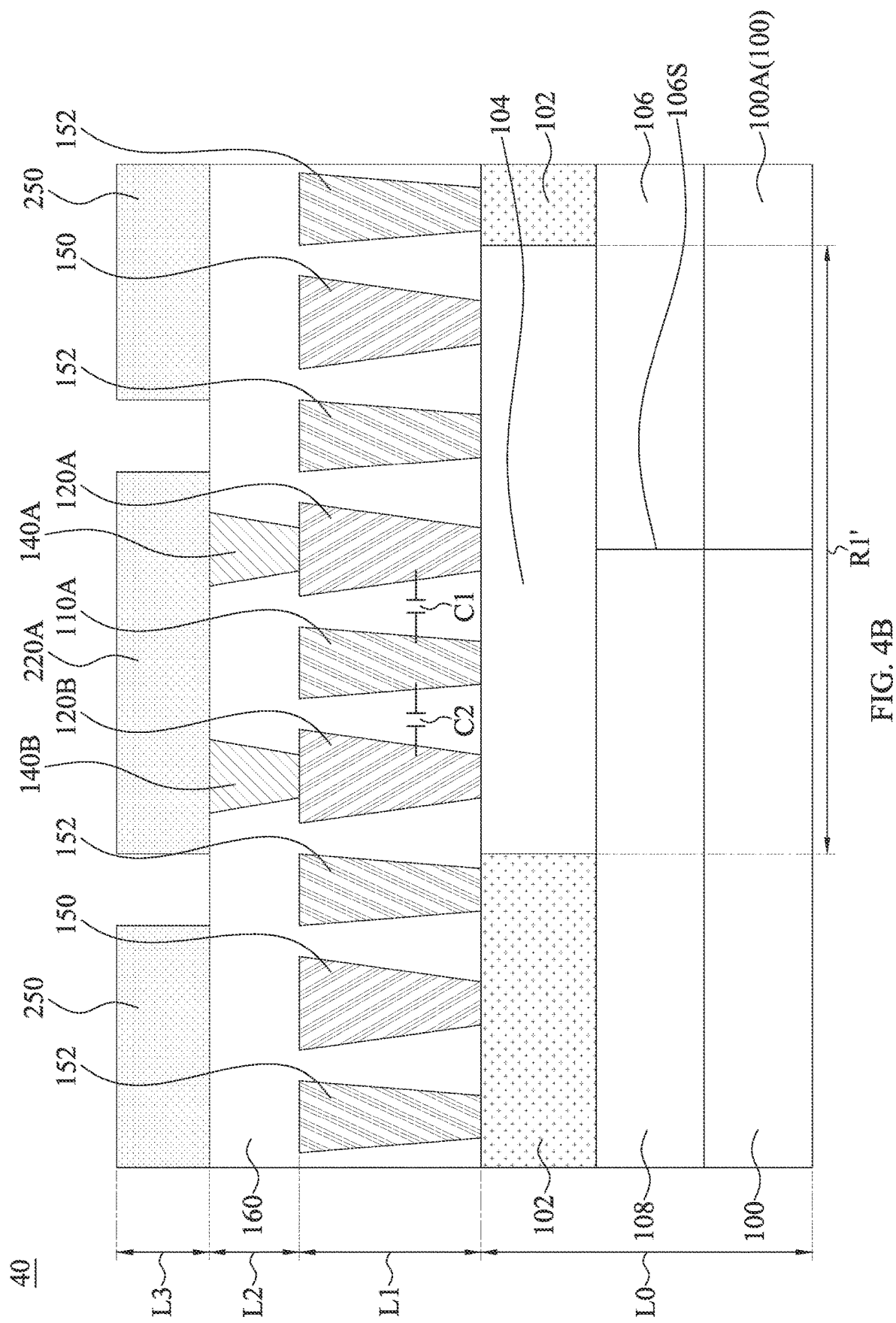

METHOD OF MANUFACTURING SEMICONDUCTOR STRUCTURE

PRIORITY CLAIM AND CROSS-REFERENCE

This application is a divisional application of prior-filed U.S. application Ser. No. 17/313,748, filed May 6, 2021, and claims the priority thereto.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs while increasing the amount of functionality that can be provided in the reduced chip area. Such scaling down has increased complexities of processing and manufacturing ICs and also increased difficulties of layout design.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4B is a cross-sectional view of a portion of the cell shown in FIG. 4A in accordance with some embodiments of the present disclosure.

DETAILED DESCRIPTION

Figure 1A:
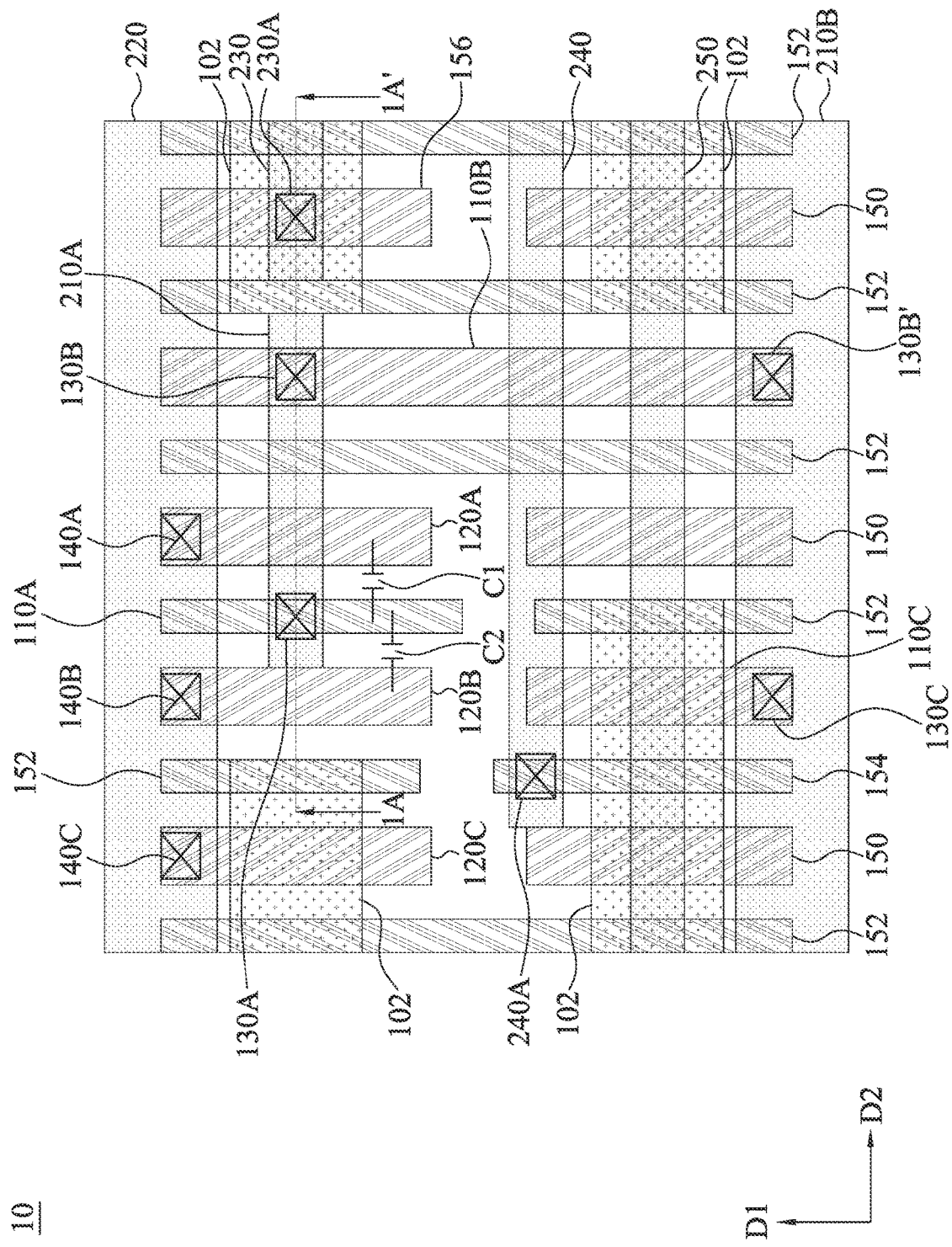
FIG. 1A is a diagram of a cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The term "standard cell" or "cell" used throughout the present disclosure refers to a group of circuit patterns in a design layout to implement specific functionalities of a circuit. A standard cell is comprised of one or more layers, and each layer includes various patterns expressed as unions of polygons. A design layout may be initially constructed by a combination of identical or different standard cells. The cells are interconnected using a routing structure. The geometries of the patterns in the cells may be adjusted at different stages of layout design in order to compensate for design and process effects. A standard cell may cover circuits corresponding to a portion or an entirety of a die to be manufactured. The standard cells may be accessible from cell libraries provided by semiconductor manufacturers or designers. In some embodiments, the standard cells are included in a standard cell library, which may be stored in a non-transitory computer-readable storage medium and accessed by a processor in various circuit design stages.

Embodiments of the present disclosure discuss one or more cells included in semiconductor structures and forming methods of the one or more cells of the semiconductor structures for stabilizing the power signal and reducing noise without additional costs in the layout area. A capacitor is formed or disposed over a substrate and free from overlapping the active region thereof from a top view perspective, while transistors are formed over the active region, the capacitor may be formed over or inserted into a white space of circuit patterns in a design layout, and thus extra capacitance can be provided to the cell for stabilizing the power signal and reducing noise without additional costs in the layout area. In addition, the capacitor formed or disposed over an isolation structure of the substrate in which a channel is not generated regardless of a power being supplied or not, and thus the arrangement is advantageous to reducing power leakage, which can increase the power efficiency.

FIG. 1A is a diagram of a cell 10 in accordance with some embodiments of the present disclosure. In some embodiments, the cell 10 can be included in a semiconductor structure which is not limited by the present disclosure.

Referring to FIG. 1A, the cell 10 includes multiple layers overlaid with one another along with various patterns in the respective layers from a top-view perspective. The cell 10 may include a substrate including one or more active regions 102 and one or more isolation structures (not separately shown in FIG. 1A), capacitors C1 and C2, conductive lines 110A-110C, 120A-120C, 150, 152, 154 and 156, conductive rails 210A-210B and 220-250, conductive vias 130A-130C, 140A-140B, 230A and 240A, and a dielectric layer 160 (not separately shown in FIG. 1A).

As shown in FIG. 1A, in some embodiments, the conductive lines 110A-110C, 120A-120C, 150, 152, 154 and 156 extend in a direction D1, and the conductive rails 210A-210B and 220-250 extend in a direction D2 substantially perpendicular to the direction D1. In some embodiments, the conductive rails 210A-210B and 220 may be referred to as power rails configured to convey power. The dielectric layer 160 may cover the conductive lines 110A-110C, 120A-120C, 150, 152, 154 and 156, and the conductive vias 130A-130C, 140A-140B, 230A and 240A. The active regions 102 may be defined and separated from each other by the isolation structures 104 (not separately shown in FIG. 1A).

As shown in FIG. 1A, the capacitor C1 is adjacent to the capacitor C2. In some embodiments, the capacitor C1 is free from overlapping the active region 102 from a top view perspective. In some embodiments, the capacitor C2 is free from overlapping the active region 102 from a top view perspective.

Figure 1B:
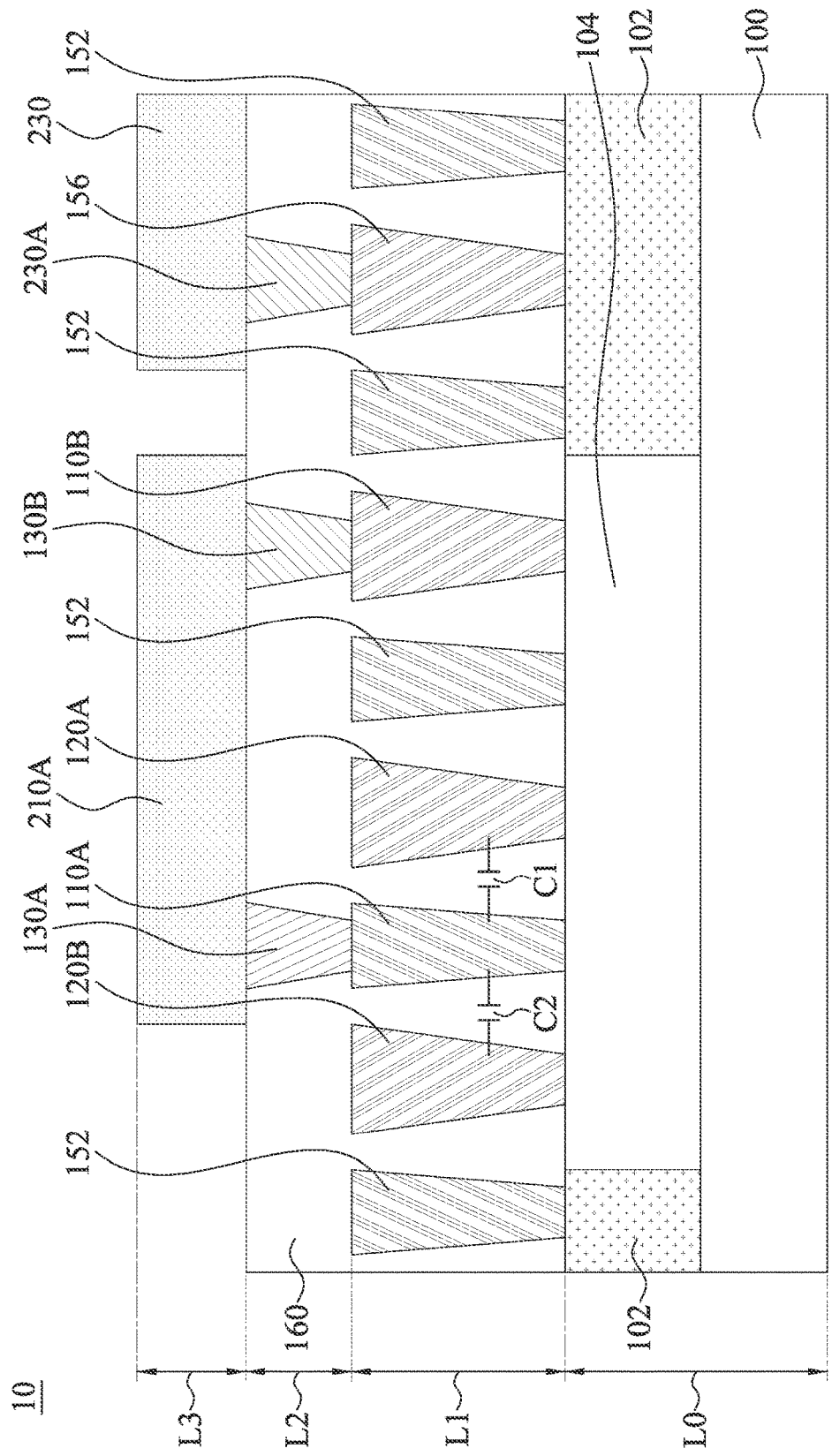
FIG. 1B is a cross-sectional view of the cell shown in FIG. 1A in accordance with some embodiments of the present disclosure.

FIG. 1B is a cross-sectional view of the cell shown in FIG. 1A in accordance with some embodiments of the present disclosure. In some embodiments, FIG. 1B shows a cross-sectional view along the cross-sectional line 1A-1A' in FIG. 1A. As shown in FIG. 1B, the dielectric layer 160 covers the conductive lines 110A, 110B, 120A, 120B, 152, and 156, and the conductive vias 130A, 130B, and 230A.

Referring to FIG. 1B, a substrate 100 includes one or more active regions 102 and one or more isolation structures 104. The isolation structure 104 may be adjacent to the active region 102. The substrate 100 may be formed of a silicon substrate or other suitable semiconductor substrate. The active region 102 may be arranged in the substrate 100 and exposed through an upper surface of the substrate 100. Although not separately shown, the active region 102 may include a first source/drain region, a second source/drain region and a channel region interposed between the two source/drain regions. The source/drain regions in the active region 102 may be an N-type active region doped with N-type impurities such as arsenic, phosphorus, or the like, or a P-type active region doped with P-type impurities such as boron or the like. The channel region in the active region 102 may be undoped or lightly doped. In some embodiments, the isolation structure 104 in the substrate 100 may define and laterally surround the active region 102. In some embodiments, the isolation structure 104 is formed of a dielectric material, such as oxide or nitride, and may be referred to as shallow trench isolation (STI).

The capacitor C1 may be over the isolation structure 104. In some embodiments, the capacitor C1 includes the conductive line 110A and the conductive line 120A over the isolation structure 104. In some embodiments, the conductive line 110A and the conductive line 120A are in contact with the substrate 100. In some embodiments, the conductive line 110A and the conductive line 120A are in contact with the isolation structure 104. In some embodiments, the conductive line 110A and the conductive line 120A are adjacent to each other and extend in the direction D1. In some embodiments, the conductive line 110A and the conductive line 120A are at substantially the same elevation. In some embodiments, the capacitor C1 includes a portion of the dielectric layer 160 laterally between the conductive line 110A and the conductive line 120A over the isolation structure 104. In some embodiments, the conductive line 110A and the conductive line 120A extend in a layer L1 over the isolation structure 104, and the layer L1 may be referred to as a conductive line layer L1. In some embodiments, the conductive line 120A is electrically insulated from the conductive line 110A. According to some embodiments of the present disclosure, while transistors are formed over the active regions 102 instead of over the isolation structure 104 (also referred to as "a while space" of circuit patterns in a design layout), the capacitor C1 formed or disposed over the isolation structure 104 (or inserted into the white space of circuit patterns in a design layout) can provide extra capacitance to the cell 10 for stabilizing the power signal and reducing noise without additional costs in the layout area. In addition, the capacitor C1 formed or disposed over the isolation structure 104 in which a channel is not generated regardless of a power being supplied or not, and thus the arrangement is advantageous to reducing power leakage, which can increase the power efficiency.

In some embodiments, the conductive line 110A is electrically connected to a voltage VSS, and the conductive line 120A is electrically connected to a voltage VDD different from the voltage VSS. In some embodiments, the voltage VSS is ground, and the voltage VDD is a positive voltage. In some embodiments, the voltage VSS is ground or a source voltage, and the voltage VDD is a drain voltage. In some embodiments, the capacitor C1 may be a P-type capacitor. The capacitor C1 may serve as a decoupling capacitor for one or more circuits corresponding to a portion or an entirety of a die formed from the semiconductor structure. In some embodiments, the capacitor C1 can be implemented as an NMOS decoupling capacitor, a PMOS decoupling capacitor, or a CMOS decoupling capacitor.

The conductive vias 130A and 130B and the conductive lines 110A and 120A are at different elevations. The conductive vias 130A and 130B may be in a layer L2 over the layer L1, and the layer L2 may be referred to as a conductive via layer L2.

The conductive rail 210A and the conductive lines 110A and 120A are at different elevations. In some embodiments, the conductive rail 210A is in the layer L3 over the layer L2, and the layer L3 may be referred to as a conductive rail layer L3. In some embodiments, the conductive rail 210A is connected to the conductive line 110A through the conductive via 130A. In some embodiments, the conductive rail 210A crosses over the conductive line 120A and electrically connects to the conductive line 110A. In some embodiments, the conductive rail 210A and the conductive lines 110A and 120A are free from overlapping the active region 102 from a top view perspective. In some embodiments, the capacitor C1 is electrically connected to the voltage VSS through the conductive rail 210A and the conductive line 110A.

Referring to FIG. 1A, similar to the arrangement of the conductive vias 130A and 130B, the conductive via 140A is in the layer L2, and the conductive rail 220 is in the layer L3. In some embodiments, the conductive rail 220 is electrically connected to the conductive line 120A through the conductive via 140A. In some embodiments, the capacitor C1 is electrically connected to the voltage VDD through the conductive rail 220 and the conductive line 120A.

The capacitor C2 may be adjacent to the capacitor C1. In some embodiments, the capacitor C1 and the capacitor C2 share a conductive line (e.g., the conductive line 110A).

In some embodiments, the capacitor C2 includes the conductive line 110A and the conductive line 120B over the isolation structure 104. In some embodiments, the conductive line 110A and the conductive line 120B are adjacent to each other and extend in the direction D1. In some embodiments, the conductive line 110A and the conductive line 120B are at substantially the same elevation. In some embodiments, the capacitor C2 includes a portion of the dielectric layer 160 laterally between the conductive line 110A and the conductive line 120B over the isolation structure 104. In some embodiments, the conductive line 110A and the conductive line 120B extend in the layer L1 over the isolation structure 104. In some embodiments, the conductive line 120B extending in the layer L1 is at a side of the conductive line 110A opposite to the conductive line 120A and over the isolation structure 104. In some embodiments, the conductive line 120B is electrically insulated from the conductive line 110A. According to some embodiments of the present disclosure, while transistors are formed over the active regions 102 instead of over the isolation structure 104 (or the "white space"), the capacitor C2 formed or disposed over the isolation structure 104 can provide extra capacitance to the cell 10 without additional costs in the layout area. In addition, the capacitor C2 formed or disposed over the isolation structure 104 is advantageous to reducing power leakage, which can increase the power efficiency. Moreover, the capacitor C1 and the capacitor C2 are adjacent to each other and share a same conductive line (e.g., the conductive line 110A), and thus the layout area utilization can be further increased.

In some embodiments, the conductive line 110A is electrically connected to the voltage VSS, and the conductive line 120B is electrically connected to the voltage VDD different from the voltage VSS. In some embodiments, the capacitor C2 may be a P-type capacitor. The capacitor C2 may serve as a decoupling capacitor for one or more circuits corresponding to a portion or an entirety of a die formed from the semiconductor structure. In some embodiments, the capacitor C2 can be implemented as an NMOS decoupling capacitor, a PMOS decoupling capacitor, or a CMOS decoupling capacitor.

A first biasing path of the cell 10 for supplying the voltage VSS may be formed between the conductive rail 210B (or the power rail) and the conductive line 110A through the conductive via 130B' arranged in the conductive via layer L2, the conductive line 110B in the conductive line layer L1, the conductive via 130B arranged in the conductive via layer L2, the conductive rail 210A in the conductive rail layer L3, and the conductive via 130A arranged in the conductive via layer L2 and directly over the conductive line 110A in the conductive line layer L1.

A second biasing path of the cell 10 for supplying the voltage VDD may be formed between the conductive rail 220 (or the power rail) and the conductive line 120A through the conductive via 140A arranged in the conductive via layer L2 and directly over the conductive line 120A in the conductive line layer L1. A second biasing path of the cell 10 for supplying the voltage VDD may be formed between the conductive rail 220 (or the power rail) and the conductive line 120B through the conductive via 140B arranged in the conductive via layer L2 and directly over the conductive line 120A in the conductive line layer L1.

In some embodiments, each of the conductive rails 230, 240 and 250 may be referred to as a data rail configured to convey data signals or a power rail configured to convey power for the semiconductor structure including the cell 10. In some embodiments, the conductive rail 230 in the layer L3 is connected to the conductive line 156 in the layer L1 through the conductive via 230A in the layer L2 and over the active region 102. In some embodiments, the conductive rail 240 in the layer L3 is connected to the conductive line 154 in the layer L1 through the conductive via 240A in the layer L2 and over the isolation structure 104. In some embodiments, the conductive rail 250 in the layer L3 crosses over the cell 10 and may serve as a power rail or a data rail for cells other than the cell 10 of the semiconductor structure.

In some embodiments, each of the conductive lines 110C, 120C, 150, 152, 154 and 156 may be referred to as a gate electrode, a source/drain conductive line, or a cell-edge gate electrode of one or more transistors of the semiconductor structure including the cell 10. In some embodiments, the conductive line 110C in the layer L1 is over the active region 102 and electrically connected to the conductive rail 210B in the layer L3 through the conductive via 130C in the layer L2. In some embodiments, the conductive line 120C in the layer L1 is over the active region 102 and electrically connected to the conductive rail 220 in the layer L3 through the conductive via 140C in the layer L2. In some embodiments, the conductive lines 150 and 152 in the layer L1 cross over the conductive rail 250 and may be electrically connected to additional conductive features (not shown in FIG. 1A) of the cell 10 of the semiconductor structure for various purposes.

The conductive line layer L1 may include a plurality of parallel conductive lines, e.g., the conductive lines 110A-110C, 120A-120C, 150, 152, 154 and 156, the conductive via layer L2 may include at least one conductive via, e.g., the conductive vias 130A-130C, 140A-140B, 230A and 240A, and the conductive rail layer L3 may include a plurality of parallel conductive rails, e.g., the conductive rails 210A-210B and 220-250. These conductive lines of the conductive line layer L1, the conductive vias of the conductive via layer L2, and the conductive rails of the conductive rail layer L3 may be formed of or include conductive materials, such as copper, tungsten, aluminum, titanium, tantalum, titanium nitride, tantalum nitride, alloys thereof, or the like. The numbers and materials of the conductive rails, the conductive lines, and conductive vias shown in FIGS. 1A-1B are for illustrative purposes only. Numbers, materials and configurations of the rails, the layers, and the vias other than those shown in FIGS. 1A-1B are within the contemplated scope of the present disclosure.

According to some embodiments of the present disclosure, the conductive lines 110A, 120A and 120B, which form the capacitors C1 and C2, and the conductive lines 110C, 120C, 150, 152, 154 and 156, each of which may be referred to a gate electrode, a source/drain conductive line, or a cell-edge gate electrode of the transistors of the semiconductor structure including the cell 10, are at in the same layer L1. Therefore, the capacitors C1 and C2 and the transistors of the semiconductor structure may be formed in the same layer L1 by the same deposition and patterning operations, thus the manufacturing process is simplified, and the costs may be reduced. In addition, the capacitors C1 and C2 may be formed as embedded capacitors within the circuit patterns of a design layout, and thus the layout area can be further reduced.

Figure 2A:
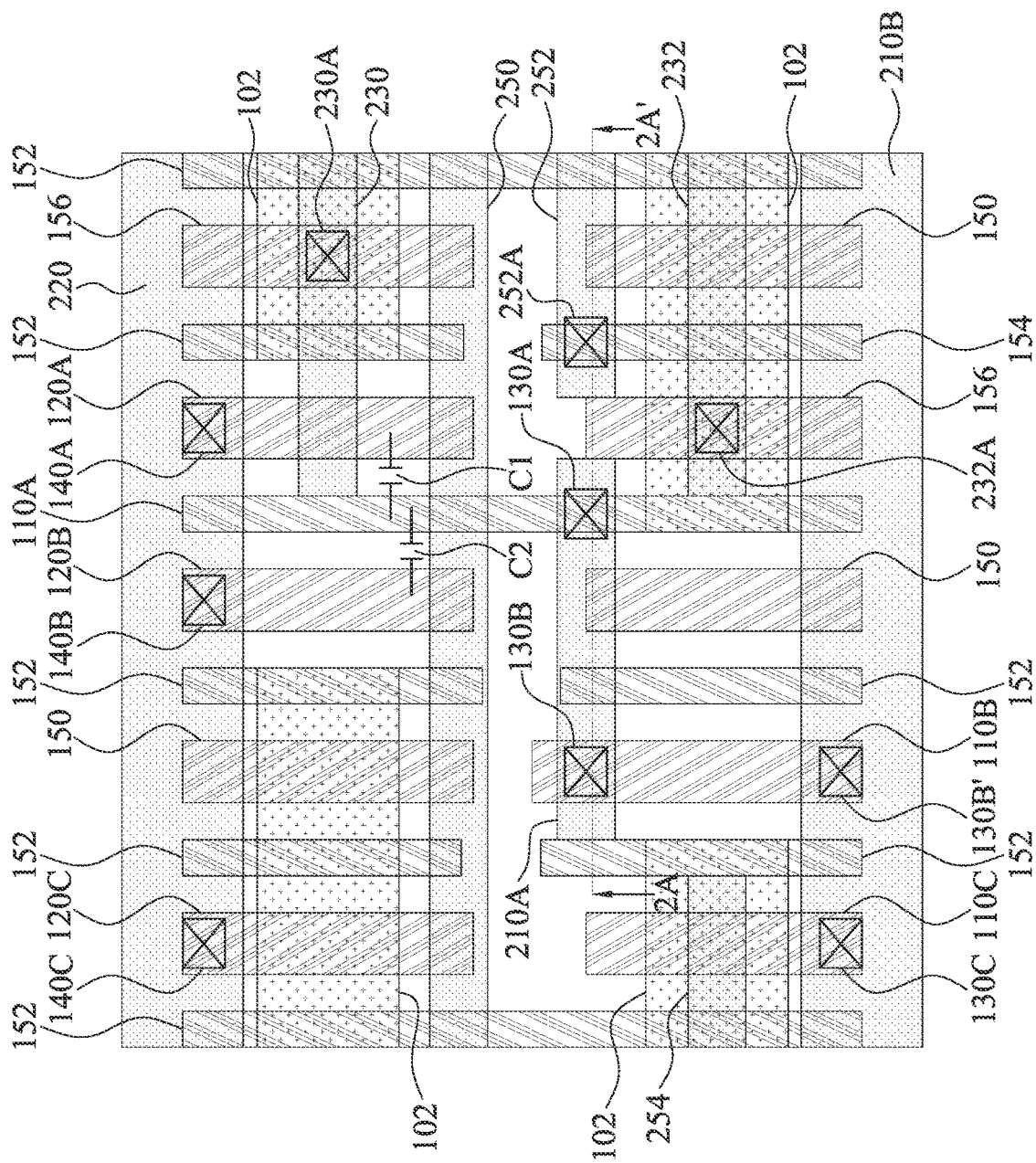
FIG. 2A is a diagram of a cell in accordance with some embodiments of the present disclosure.
Figure 2B:
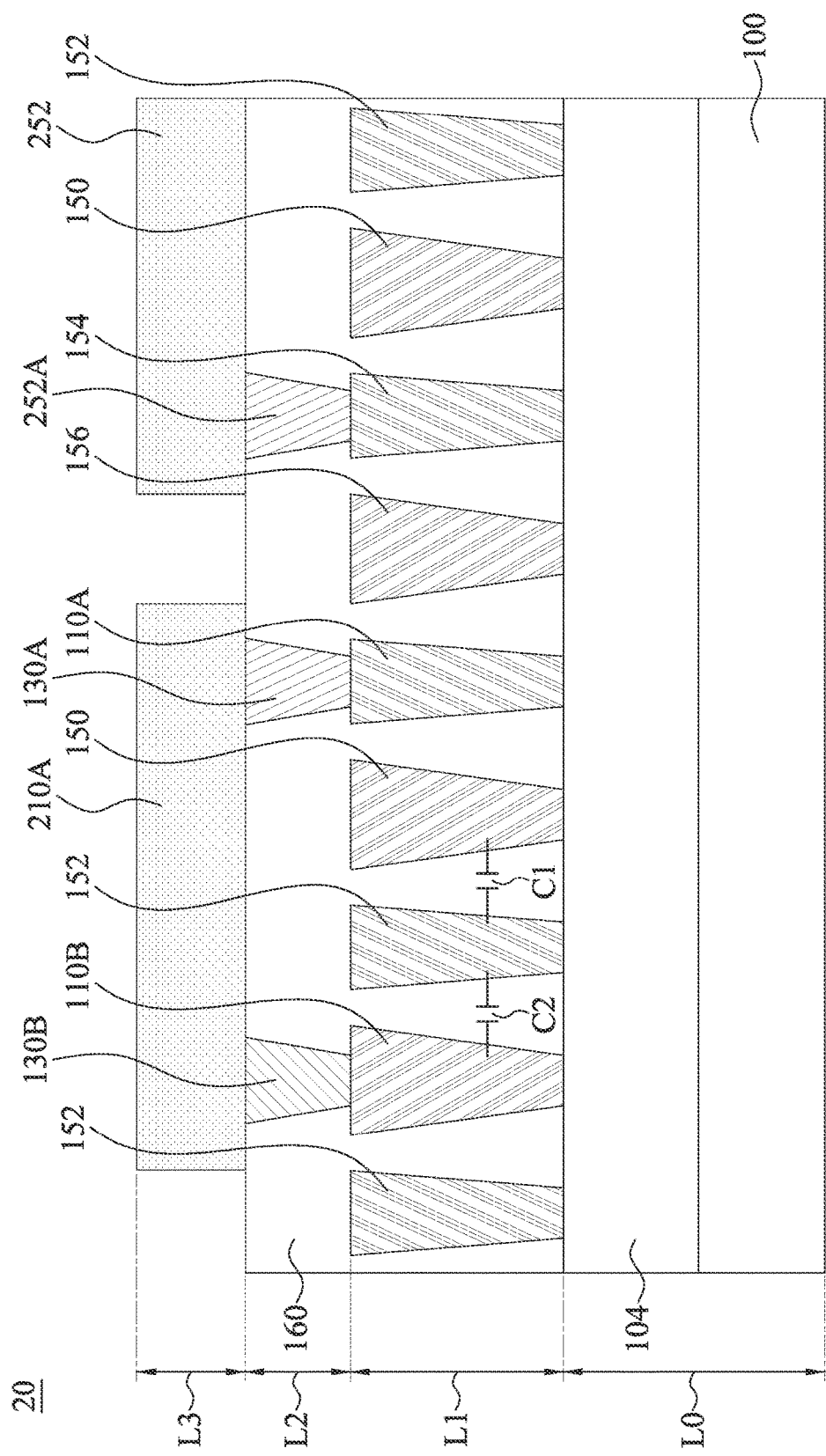
FIG. 2B is a cross-sectional view of the cell shown in FIG. 2A in accordance with some embodiments of the present disclosure.

FIG. 2A is a diagram of a cell 20 in accordance with some embodiments of the present disclosure, and FIG. 2B is a cross-sectional view of the cell 20 shown in FIG. 2A in accordance with some embodiments of the present disclosure. In some embodiments, FIG. 2B shows a cross-sectional view along the cross-sectional line 2A-2A' in FIG. 2A. The cell 20 is similar to the cell 10 in many aspects, and thus descriptions of these aspects are not repeated for brevity. Referring to FIGS. 1A-1B and FIGS. 2A-2B, the cell 20 differs from the cell 10 in, for example, the configurations of the conductive vias 130A and 130B in the conductive via layer L2 and the configurations in the conductive rail layer L3.

In some embodiments, the conductive rail 210A crosses over the conductive lines 150 and 152 to electrically connect the conductive via 130A to the conductive via 130B. In some embodiments, the conductive rail 210A is between the conductive rail 230A and the conductive rail 210B. In some embodiments, the conductive line 120A and the conductive line 120B may be free from overlapping with the conductive rail 210A.

In some embodiments, the cell 20 further includes conductive vias 232A and 252A in the layer L2, and conductive rails 232, 252, and 254 in the layer L3. In some embodiments, the conductive rail 232 in the layer L3 is connected to the conductive line 156 in the layer L1 through the conductive via 232A in the layer L2 and over the active region 102. In some embodiments, the conductive rail 252 in the layer L3 is connected to the conductive line 154 in the layer L1 through the conductive via 252A in the layer L2 and over the isolation structure 104. In some embodiments, the conductive rail 254 in the layer L3 crosses over the conductive lines 110A and 152 and may serve as a power rail or a data rail for cells other than the cell 10 of the semiconductor structure.

Figure 3A:
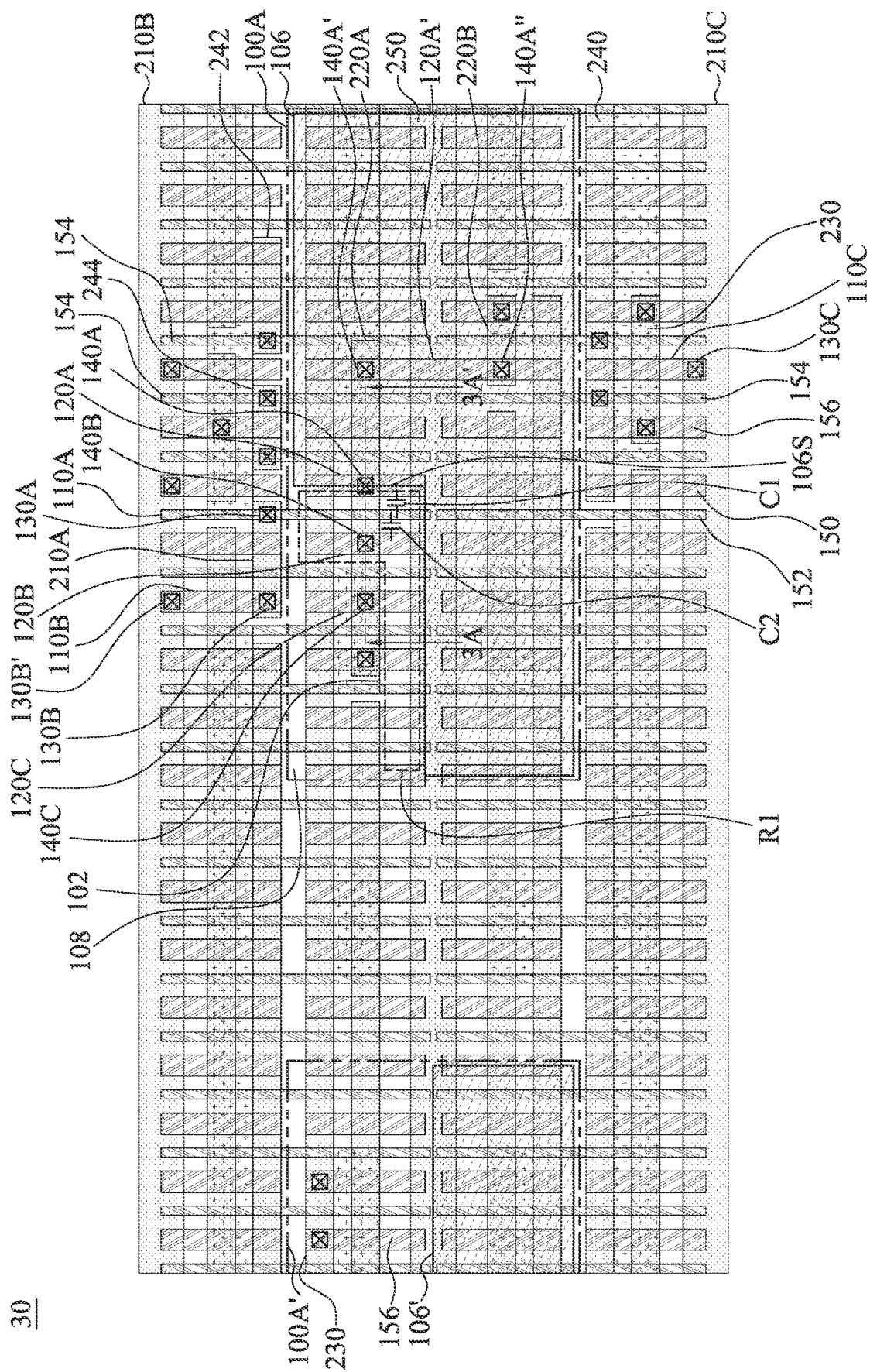
FIG. 3A is a diagram of a cell in accordance with some embodiments of the present disclosure.

FIG. 3A is a diagram of a cell 30 in accordance with some embodiments of the present disclosure. In some embodiments, the cell 30 can be included in a semiconductor structure which is not limited by the present disclosure. The cell 30 is similar to the cell 10 in many aspects, and thus descriptions of these aspects are not repeated for brevity. Referring to FIG. 1A and FIG. 3A, the cell 30 differs from the cell 10 in, for example, that the substrate 100 may further include doping regions 106, 106' and 108 and well layers (or strips) 100A and 100A'.

Referring to FIG. 3A, the substrate 100 may include first-type doping regions 106 and 106', a second-type doping region 108, and well layers (or strips) 100A and 100A'. In some embodiments, the first-type doping regions 106 and 106' may be P-type doping regions, and the second-type doping region 108 may be an N-type doping region. In some embodiments, the capacitor C1 is over a region R1 proximal to a boundary 106S between the first-type doping region 106 and the second-type doping region 108. In some embodiments, the capacitor C2 is over a region R1 proximal to a boundary 106S between the first-type doping region 106 and the second-type doping region 108. In some embodiments, the region R1 is free from overlapping with the active region 102 from a top view perspective.

In some embodiments, the well layers 100A and 100A may be N-well layers (or strips). In some embodiments, the well layers 100A and 100A' have the same doping type as that of the second-type doping region 108. In some embodiments, the doping regions 106 and 108 may overlap with the well layer 100A. In some embodiments, the boundary 106S between the first-type doping region 106 and the second-type doping region 108 is over the well layer 100A.

In some embodiments, the cell 30 further includes conductive rails 242 and 244 in the layer L3. In some embodiments, the conductive rail 242 in the layer L3 is connected to a conductive line 154 in the layer L1 through a conductive via in the layer L2. In some embodiments, the conductive rail 244 in the layer L3 is connected to a conductive line 154 in the layer L2 through a conductive via in the layer L2.

A first biasing path of the cell 30 for supplying the voltage VSS may be formed between the conductive rail 210B (or the power rail) and the conductive line 110A through the conductive via 130B' arranged in the conductive via layer L2, the conductive line 110B in the conductive line layer L1, the conductive via 130B arranged in the conductive via layer L2, the conductive rail 210A in the conductive rail layer L3, and the conductive via 130A arranged in the conductive via layer L2 and directly over the conductive line 110A in the conductive line layer L1.

A second biasing path of the cell 30 for supplying the voltage VDD may be formed between the conductive rail 220B (or the power rail) and the conductive line 120A through the conductive via 140A" arranged in the conductive via layer L2, the conductive line 120A' in the conductive via line layer L1, the conductive via 140A' in the conductive via layer L2, the conductive rail 220A in the conductive rail layer L3, and the conductive via 140A arranged in the conductive via layer L2 and directly over the conductive line 120A in the conductive line layer L1.

A second biasing path of the cell 30 for supplying the voltage VDD may be formed between the conductive rail 220B (or the power rail) and the conductive line 120B through the conductive via 140A" arranged in the conductive via layer L2, the conductive line 120A' in the conductive line layer L1, the conductive via 140A' in the conductive via layer L2, the conductive rail 220A in the conductive rail layer L3, and the conductive via 140B arranged in the conductive via layer L2 and directly over the conductive line 120B in the conductive line layer L1.

In some embodiments, the conductive line 110A is electrically connected to the voltage VSS, and the conductive line 120A is electrically connected to the voltage VDD different from the voltage VSS. In some embodiments, the voltage VSS is ground, and the voltage VDD is a positive voltage. In some embodiments, the voltage VSS is ground or a source voltage, and the voltage VDD is a drain voltage. In some embodiments, the capacitor C1 may be a P-type capacitor. The capacitor C1 may serve as a decoupling capacitor for one or more circuits corresponding to a portion or an entirety of a die formed from the semiconductor structure. In some embodiments, the conductive line 120B is electrically connected to the voltage VDD. In some embodiments, the capacitor C2 may be a P-type capacitor.

In some embodiments, the well layer 100A is electrically connected to the conductive rail 210A through the second-type doping region 108 and the active region 102, so that a body voltage may be supplied to the substrate 100.

Figure 3B:
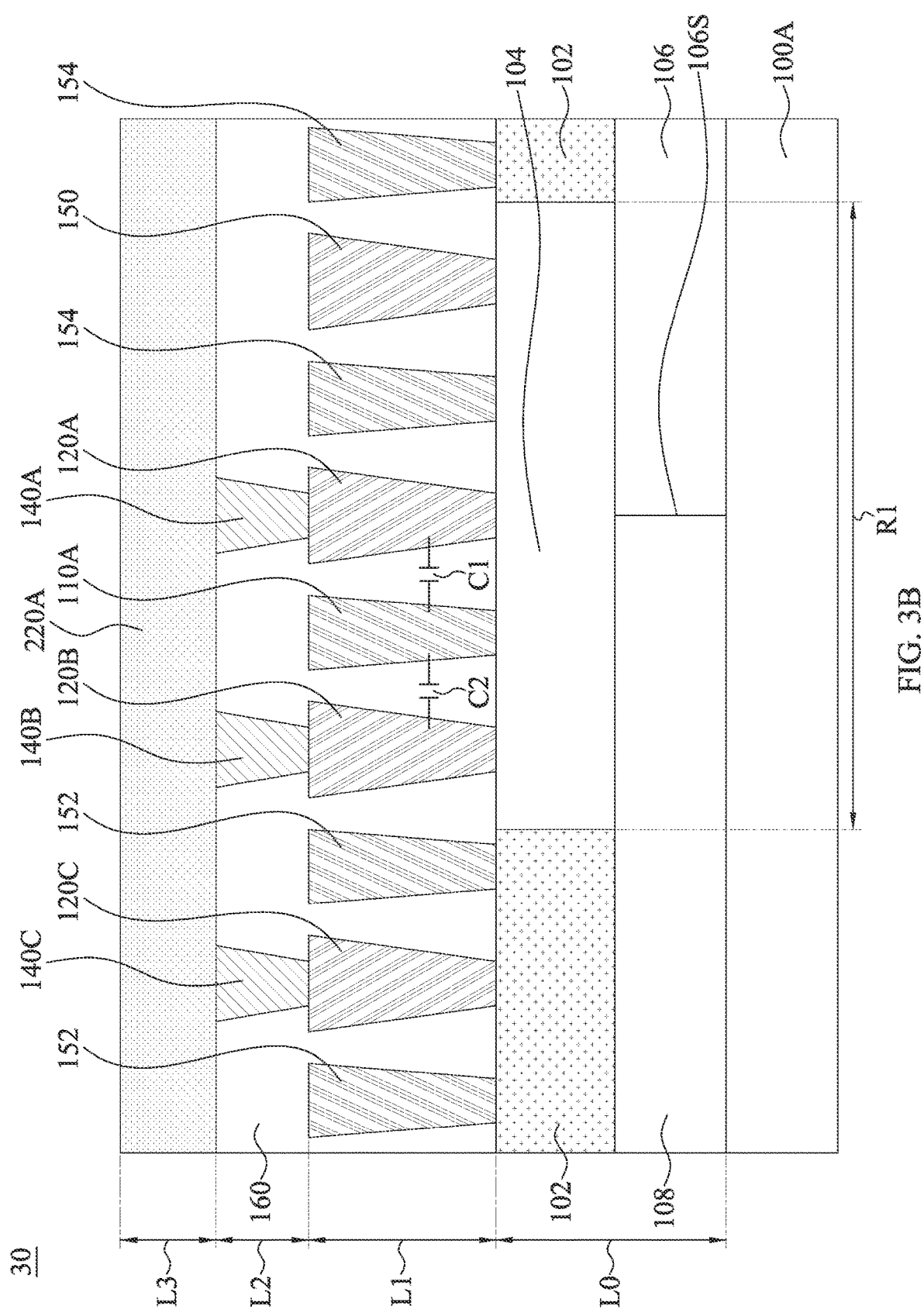
FIG. 3B is a cross-sectional view of a portion of the cell shown in FIG. 3A in accordance with some embodiments of the present disclosure.

FIG. 3B is a cross-sectional view of a portion of the cell 30 shown in FIG. 3A in accordance with some embodiments of the present disclosure. FIG. 3B shows a cross-sectional view along the cross-sectional line 3A-3A' in FIG. 3A.

Referring to FIG. 3B, the substrate 100 may include the active region 102, the isolation structure 104, the first-type doping region 106, the second-type doping region 108, and the well layer 100A. In some embodiments, the active region 102 and the isolation structure 104 are over the first-type doping region 106 and the second-type doping region 108. In some embodiments, the first-type doping region 106 and the second-type doping region 108 are over the well layer 100A. In some embodiments, the boundary 106S between the first-type doping region 106 and the second-type doping region 108 is directly under the isolation structure 104.

In some embodiments, the region R1 proximal to the boundary 106S between the first-type doping region 106 and the second-type doping region 108 overlaps with the isolation structure 104. In some embodiments, the capacitor C1 overlaps with a portion of the second-type doping region 108 within the region R1. In some embodiments, the capacitor C2 overlaps with a portion of the second-type doping region 108 within the region R1. In some embodiments, the conductive line 120A of the capacitor C1 is directly over the boundary 106S between the first-type doping region 106 and the second-type doping region 108.

In some embodiments, in order to supply the body voltage to the substrate 100 from a conductive rail (e.g., the conductive rail 210A), the second-type doping region 108 is vertically interposed between the active region 102 and the well layer 100A which has the same doping type as that of the second-type doping region 108. As a result, the boundary 106S between the first-type doping region 106 and the second-type doping region 108 is generated. While possible shifts in the position of the boundary 106S may occur during the manufacturing process, it may be highly risky to form transistors over the region R1 proximal to the boundary 106S since the conductivity type (i.e., P-type or N-type) of the as-formed transistors are determined by the conductivity type of the doping region (e.g., the first-type doping region 106 or the second-type doping region 108) where channels are formed. The as-formed transistors may have an undesired conductivity type due to the shifts in the position of the doping region thereunder. Therefore, the region R1 proximal to the boundary 106S is usually preserved as a "white space" without forming transistors thereon.

According to some embodiments of the present disclosure, the capacitor C1 and the capacitor C2 formed or disposed over the region R1 proximal to the boundary 106S between the first-type doping region 106 and the second-type doping region 108 (or inserted into the white space of circuit patterns in a design layout) can provide extra capacitance to the cell 30 for stabilizing the power signal and reducing noise without additional costs in the layout area. In addition, since transistors are not formed over the region R1 proximal to the boundary 106S between the first-type doping region 106 and the second-type doping region 108, the isolation structure 104 may be formed over or overlapping with the region R1. Therefore, the capacitor C1 and the capacitor C2 can be formed or disposed over the isolation structure 104 in which a channel is not generated regardless of a power being supplied or not, which is advantageous to reducing power leakage and increasing the power efficiency.

The numbers and doping types of the doping regions and well layers shown in FIGS. 3A-3B are for illustrative purposes only. Numbers, doping types and configurations of the doping regions and well layers other than those shown in FIGS. 3A-3B are within the contemplated scope of the present disclosure.

Figure 4A:
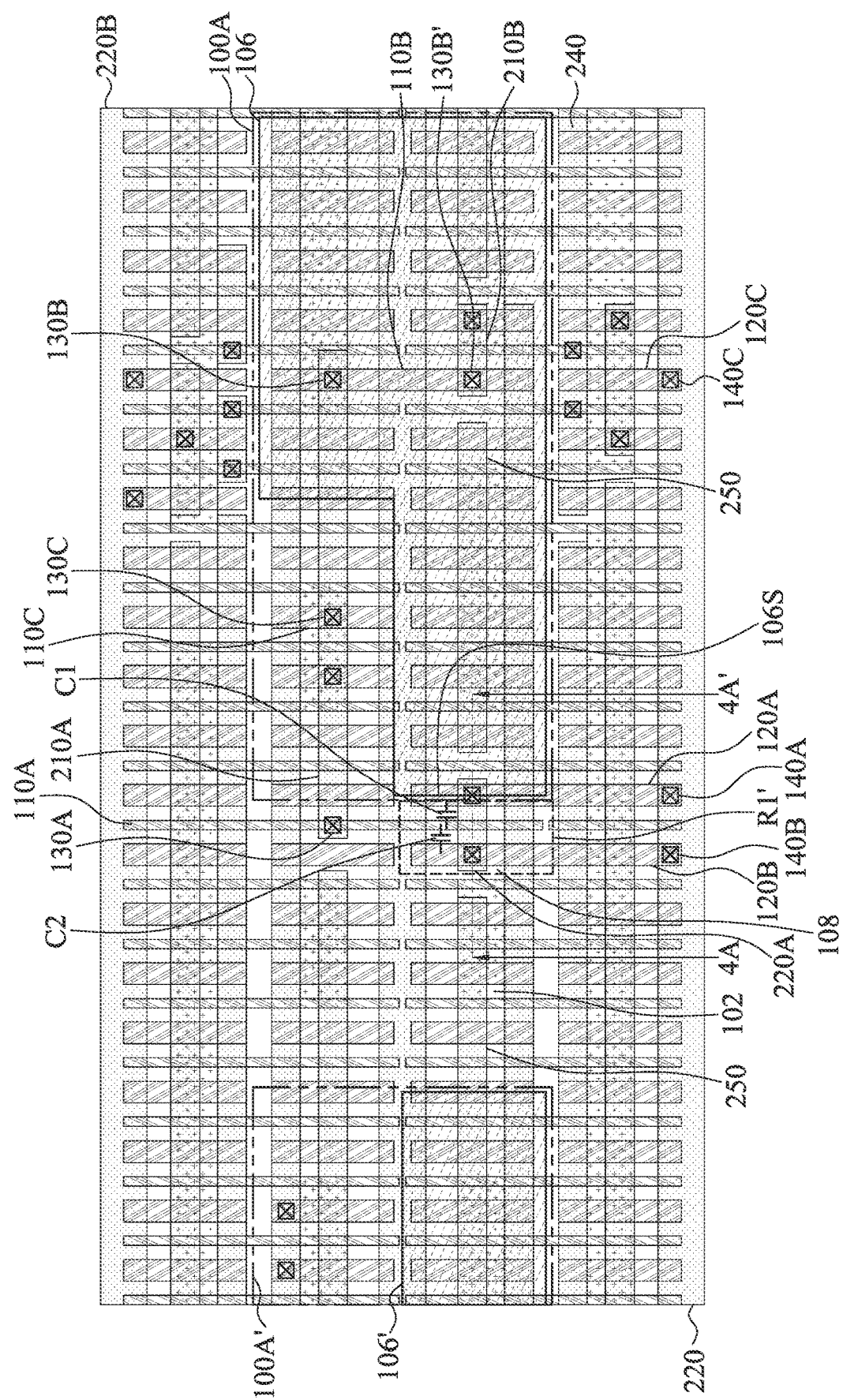
FIG. 4A is a diagram of a cell in accordance with some embodiments of the present disclosure.

FIG. 4A is a diagram of a cell 40 in accordance with some embodiments of the present disclosure. In some embodiments, the cell 40 can be included in a semiconductor structure which is not limited by the present disclosure. The cell 40 is similar to the cell 30 in many aspects, and thus descriptions of these aspects are not repeated for brevity. The differences between the cell 30 and the cell 40 are described as follows.

Referring to FIG. 4A, the substrate 100 may include first-type doping regions 106 and 106', a second-type doping region 108, and well layers 100A and 100A'. In some embodiments, the first-type doping regions 106 and 106' may be P-type doping regions, and the second-type doping region 108 may be an N-type doping region. In some embodiments, the capacitor C1 is over a region R1' proximal to a boundary 106S between the first-type doping region 106 and the second-type doping region 108. In some embodiments, the capacitor C2 is over a region R1' proximal to a boundary 106S between the first-type doping region 106 and the second-type doping region 108. In some embodiments, the region R1' is free from overlapping with the active region 102 from a top view perspective.

A first biasing path of the cell 40 for supplying the voltage VDD may be formed between the conductive rail 210B (or the power rail) and the conductive line 110A through the conductive via 130B' arranged in the conductive via layer L2, the conductive line 110B in the conductive line layer L1, the conductive via 130B arranged in the conductive via layer L2, the conductive rail 210A in the conductive rail layer L3, and the conductive via 130A arranged in the conductive via layer L2 and directly over the conductive line 110A in the conductive line layer L1.

A second biasing path of the cell 40 for supplying the voltage VSS may be formed between the conductive rail 220 (or the power rail) and the conductive via 140A arranged in the conductive via layer L2 and directly over the conductive line 120A in the conductive line layer L1. A second biasing path of the cell 40 for supplying the voltage VSS may be formed between the conductive rail 220 and the conductive via 140B arranged in the conductive via layer L2 and directly over the conductive line 120B in the conductive line layer L1.

In some embodiments, the conductive line 110A is electrically connected to the voltage VDD, and the conductive line 120A is electrically connected to the voltage VSS different from the voltage VSS. In some embodiments, the voltage VSS is ground, and the voltage VDD is a positive voltage. In some embodiments, the voltage VSS is ground or a source voltage, and the voltage VDD is a drain voltage. In some embodiments, the capacitor C1 may be a N-type capacitor. The capacitor C1 may serve as a decoupling capacitor for one or more circuits corresponding to a portion or an entirety of a die formed from the semiconductor structure. In some embodiments, the conductive line 120B is electrically connected to the voltage VSS. In some embodiments, the capacitor C2 may be a N-type capacitor.

FIG. 4B is a cross-sectional view of a portion of the cell 40 shown in FIG. 4A in accordance with some embodiments of the present disclosure. FIG. 4B shows a cross-sectional view along the cross-sectional line 4A-4A' in FIG. 4A.

In some embodiments, the capacitor C1 overlaps with a portion of the second-type doping region 108 within the region R1'. In some embodiments, the conductive line 110A of the capacitor C1 is free from overlapping with the well layer 100A. In some embodiments, the conductive line 120A of the capacitor C1 is directly over the boundary 106S between the first-type doping region 106 and the second-type doping region 108. In some embodiments, the capacitor C2 overlaps with a portion of the second-type doping region 108 within the region R1'. In some embodiments, the capacitor C2 is free from overlapping with the well layer 100A.

FIGS. 5A to 5D are cross-sectional views of intermediate stages of a method of manufacturing a semiconductor structure in accordance with some embodiments of the present disclosure.

Figure 5A:
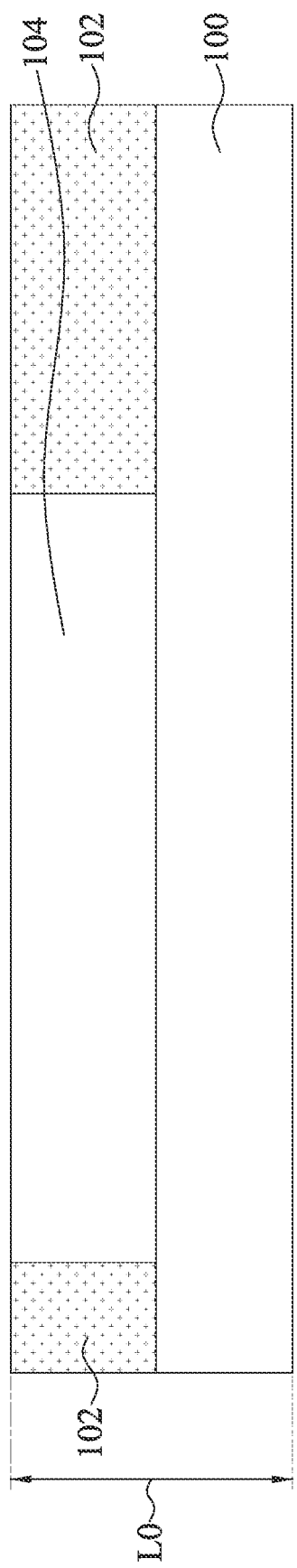
FIGS. 5A to 5D are cross-sectional views of intermediate stages of a method of manufacturing a semiconductor structure in accordance with some embodiments of the present disclosure.

Referring to FIG. 5A, a substrate 100 including one or more active regions 102 and one or more isolation structures 104 is provided or formed. The substrate 100 may be formed of a silicon substrate or other suitable semiconductor substrate, and then active regions 102 and isolation structures 104 may be formed in the substrate 100. The active region 102 may include a first source/drain region, a second source/drain region and a channel region interposed between the two source/drain regions. In some embodiments, the isolation structure 104 is formed of a dielectric material, such as oxide or nitride, and may be referred to as shallow trench isolation (STI).

Figure 5B:
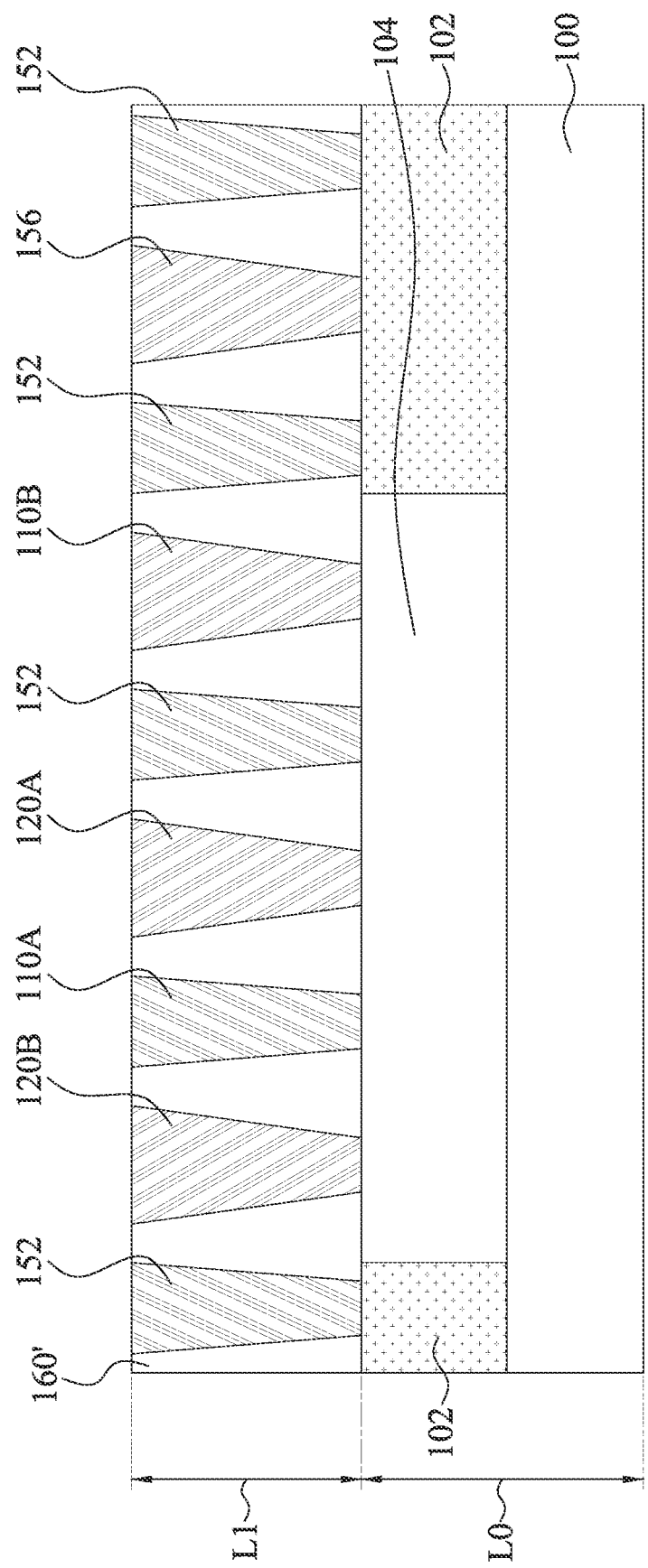

Referring to FIG. 5B, a dielectric layer 160' is deposited over the active region 102 and the isolation structure 104. The dielectric layer 160' may be referred to as interlayer dielectric (ILD). The dielectric layer 160' may be formed of a dielectric material, such as oxide, nitride, oxynitride, carbide, or other suitable dielectric materials. The dielectric layer 160' may be formed by a deposition operation, such as spin coating, physical vapor deposition (PVD), chemical vapor deposition (CVD), plasma-enhanced CVD (PECVD), atomic layer deposition (ALD), or any other suitable process.

The dielectric layer 160' is then patterned to form trenches exposing portions of the upper surface of the active region 102 and the upper surface of the isolation structure 104. The trenches extend in parallel directions. The patterning of the dielectric layer 160' may be performed using photolithography and etching operations. The etching operation may be a dry etch, a wet etch, an ion reactive etch (RIE), or the like. A conductive material, such as copper, tungsten, aluminum, titanium, tantalum, titanium nitride and tantalum nitride is then formed in the trenches to form conductive lines (e.g., conductive lines 110A, 110B, 120A, 152, and 156) over the active region 102 and the isolation structure 104. In some embodiments, the conductive lines may include a multilayer structure (not separately shown), such as including at least one of a seed layer, a diffusion barrier layer and a main metal layer. The conductive lines may be formed using CVD, PVD, ALD, electroplating, electroless plating, or other suitable processes. In some embodiments, excess materials of the conductive lines are formed over the upper surface of the dielectric layer 160'. In such situation, a planarization operation may be involved to remove the excess materials and level the upper surfaces of the conductive lines. The planarization operation may include such as mechanical grinding, chemical mechanical planarization (CMP) or other suitable operations. The as-formed conductive lines extend in parallel directions over the isolation structure 104.

Figure 5C:
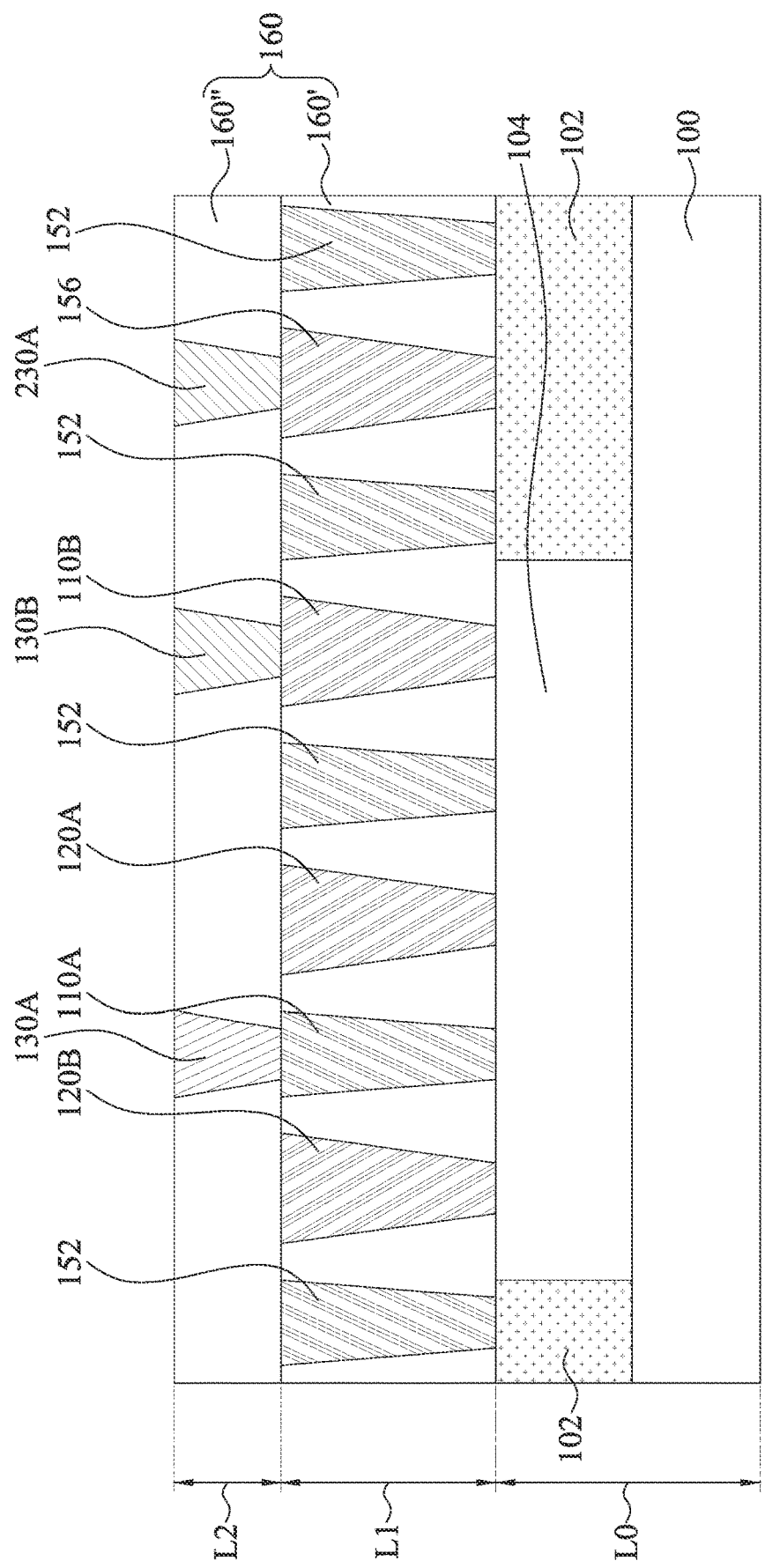

Referring to FIG. 5C, a patterned dielectric layer 160" is formed over the dielectric layer 160' and the conductive lines. Initially, a material of the dielectric layer 160" is deposited over the dielectric layer 160' and the conductive lines, followed by a patterning operation. Through vias are formed through the dielectric layer 160" and expose the conductive lines. The material of the dielectric layer 160" may include oxide, nitride, oxynitride, carbide, or other dielectric materials. The deposition and patterning operations for the patterned dielectric layer 160" are similar to those of the dielectric layer 160'. Subsequently, as shown in FIG. 5C, a conductive material is deposited in the through vias using, e.g., CVD, PVD, ALD, plating, or other suitable deposition operations to form conductive vias (e.g., conductive vias 130A, 130B, and 230A). A planarization operation, such as CMP, may be employed to level the upper surface of the patterned dielectric layer 160". The conductive vias may have a via height equal to the thickness of the dielectric layer 160". The dielectric layers 160' and 160" together form a dielectric layer 160.

Figure 5D:
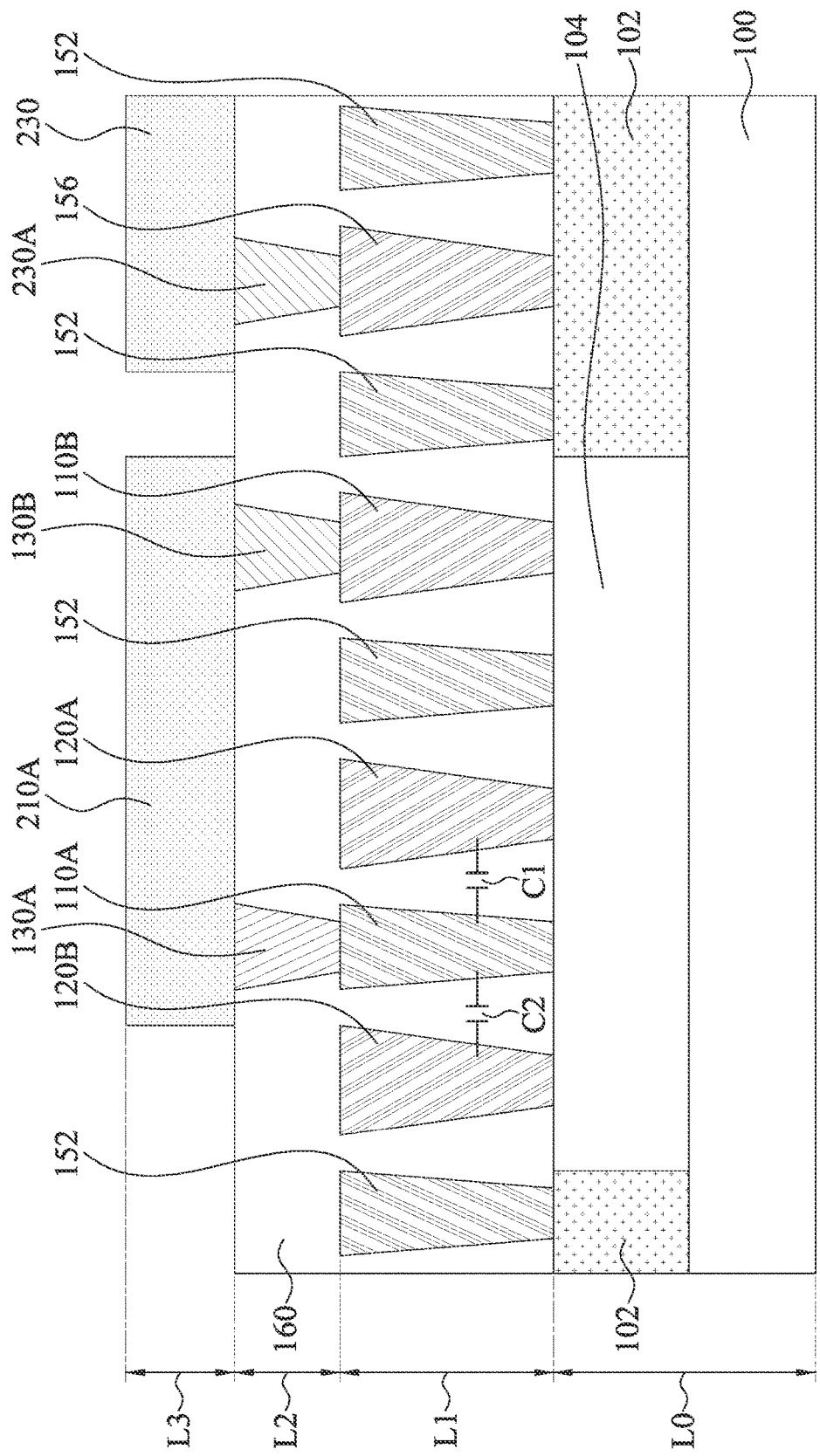

Referring to FIG. 5D, a mask layer (not separately shown in FIG. 5D) is formed over the dielectric layer 160, and the mask layer is patterned to form one or more trenches (not explicitly shown) exposing the conductive vias (e.g., the conductive vias 130A, 130B, and 230A). The trenches extend in parallel directions. The trenches may extend in a direction substantially perpendicular to which the conductive lines extend in. A conductive material is then formed in the trenches to form conductive rails (e.g., conductive rails 210A and 230). The mask layer is then removed or stripped off after the conductive rails are formed.

FIGS. 6A to 6D are cross-sectional views of intermediate stages of a method of manufacturing a semiconductor structure in accordance with some embodiments of the present disclosure.

Figure 6A:
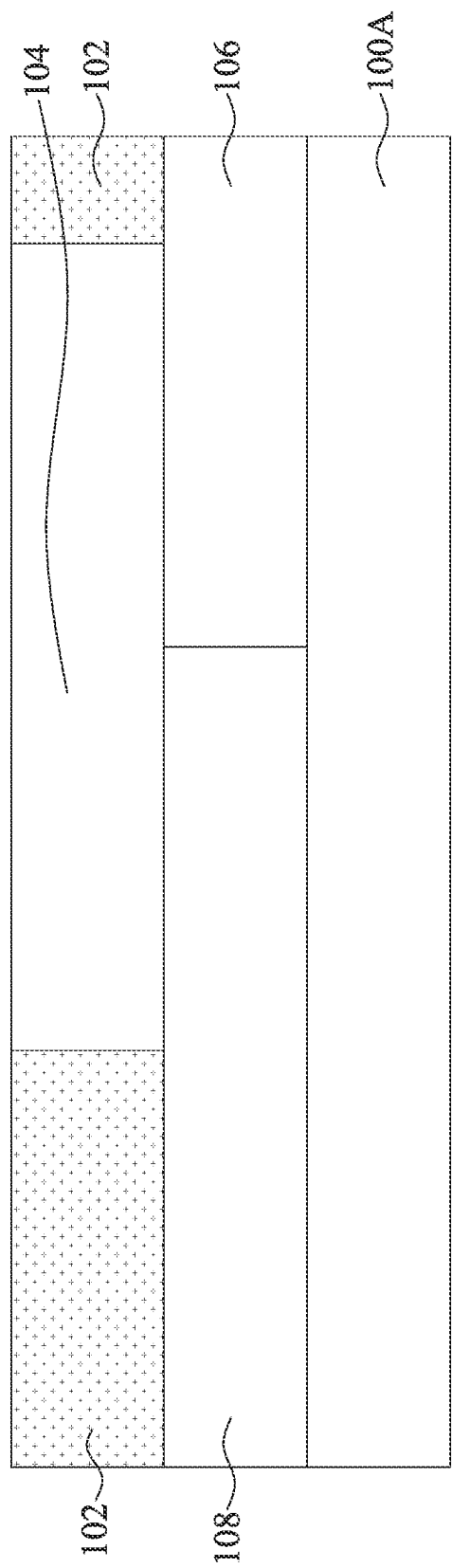
FIGS. 6A to 6D are cross-sectional views of intermediate stages of a method of manufacturing a semiconductor structure in accordance with some embodiments of the present disclosure.

Referring to FIG. 6A, a substrate 100 may be provided or formed, and a first-type doping region 106 and a second-type doping region 108 may be formed in the substrate 100. One or more active regions 102 and one or more isolation structures 104 may be formed over the doping regions 106 and 108 in the substrate 100. The doping may be carried out using an ion implantation process or a diffusion process known in the art.

Figure 6B:
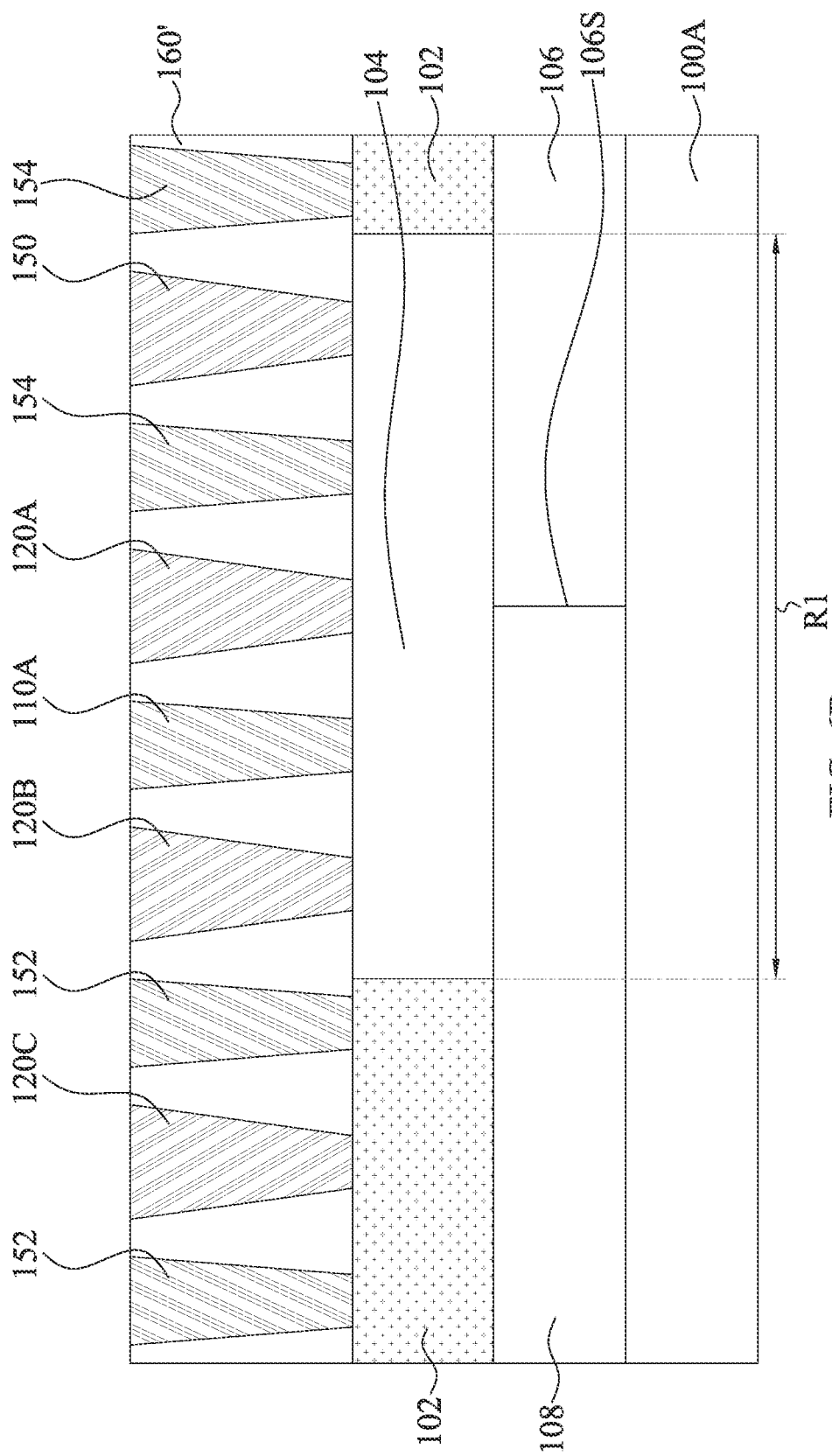

Referring to FIG. 6B, a dielectric layer 160' is deposited over the active region 102 and the isolation structure 104, and conductive lines (e.g., conductive lines 110A, 120A-120C, 152, and 154) are formed over the active region 102 and the isolation structure 104 within the dielectric layer 160'. The conductive lines 110A and 120A-120B may be formed over a boundary 106S between the first-type doping region 106 and the second-type doping region 108. The dielectric layer 160' and the conductive lines may be formed in a similar manner to that forming the dielectric layer 160' and the conductive lines with reference to FIG. 5B.

Figure 6C:
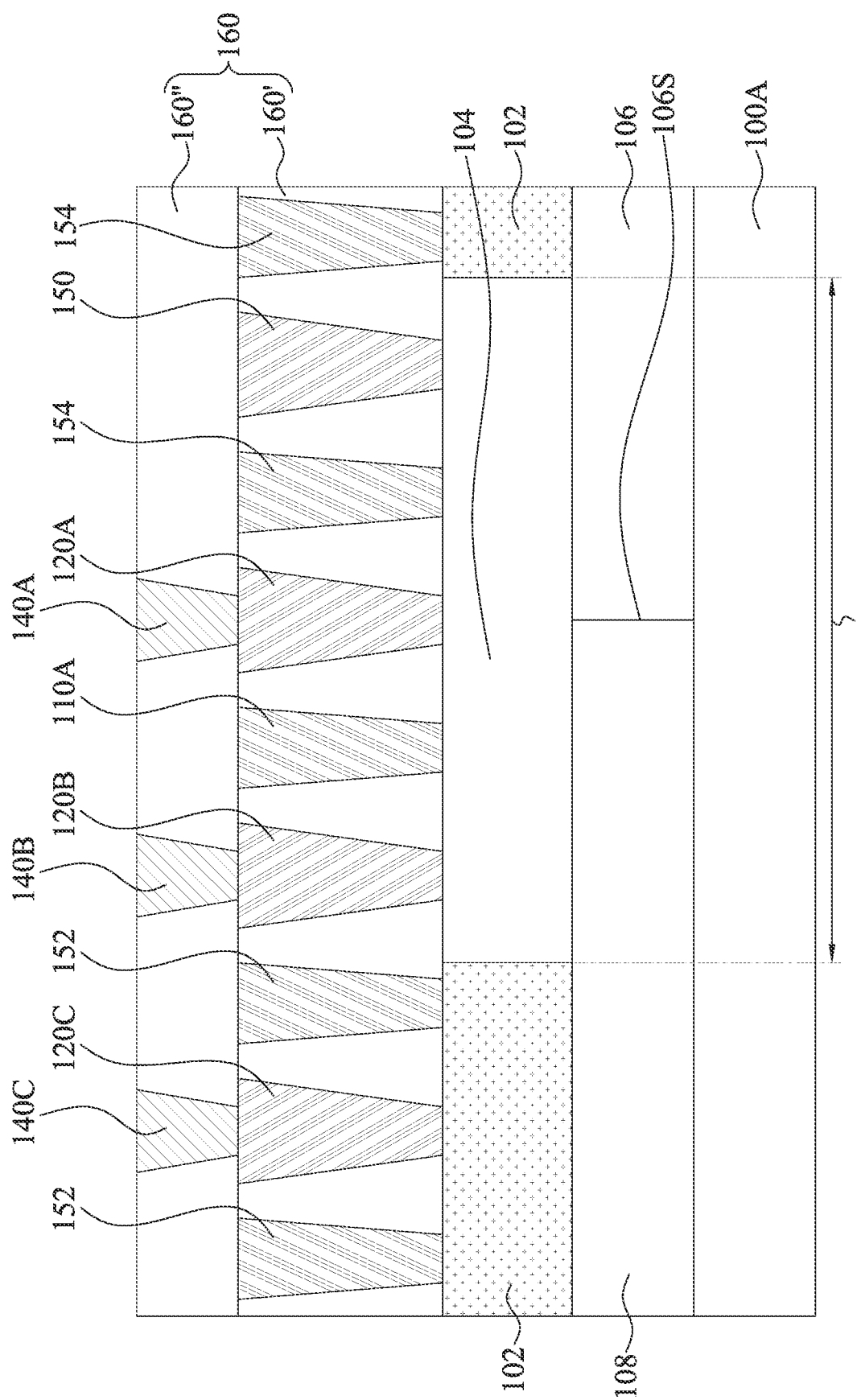

Referring to FIG. 6C, a dielectric layer 160" is deposited over the conductive lines (e.g., conductive lines 110A, 120A-120C, 152, and 154), and conductive vias (e.g., conductive vias 140A-140C) are formed over the conductive lines and within the dielectric layer 160". The dielectric layers 160' and 160" together form a dielectric layer 160. The dielectric layer 160" and the conductive vias may be formed in a similar manner to that forming the dielectric layer 160" and the conductive vias with reference to FIG. 5C.

Figure 6D:
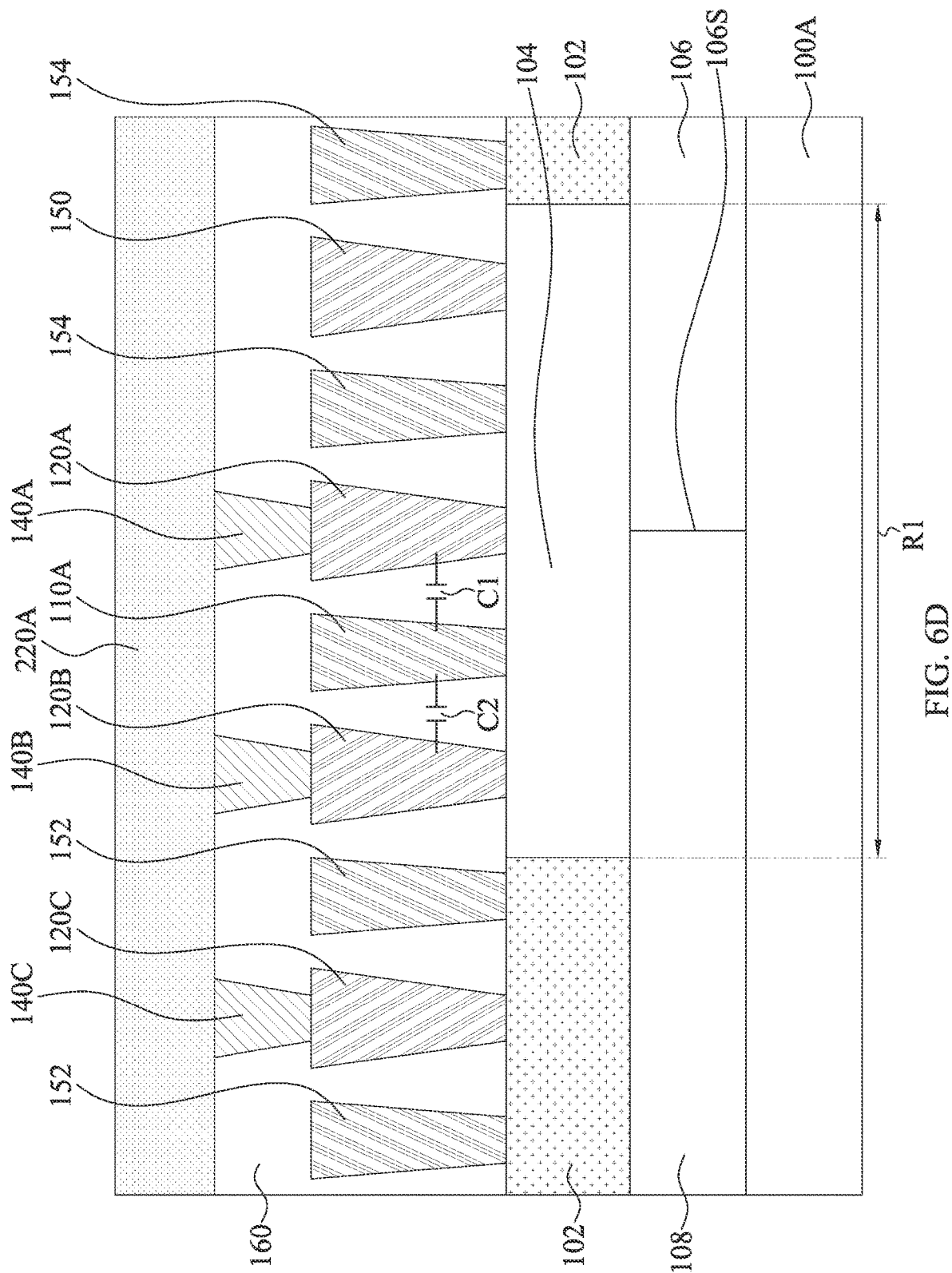

Referring to FIG. 6D, conductive rails (e.g., the conductive rail 210A) are formed over the conductive vias. The conductive rails may extend in a direction substantially perpendicular to which the conductive lines extend in. The conductive rails may be formed in a similar manner to that forming the conductive rails with reference to FIG. 5D.

According to an embodiment, a semiconductor structure includes a substrate and a first capacitor. The substrate includes an active region. The first capacitor includes a first conductive line and a second conductive line over and in contact with the substrate and free from overlapping the active region from a top view perspective.

According to an embodiment, a semiconductor structure includes a substrate, a first conductive line, and a second conductive line. The substrate includes an isolation structure. The first conductive line extends in a first direction in a first layer and is in contact with the isolation structure. The second conductive line extends in the first layer adjacent to the first conductive line and is in contact with the isolation structure. The second conductive line is electrically insulated from the first conductive line.

According to an embodiment, a method of manufacturing a semiconductor structure includes: forming an isolation structure in a substrate; forming a first conductive line and a second conductive line extending in a first direction in contact with the isolation structure; depositing a dielectric layer over the first conductive line and the second conductive line; forming a first conductive via and a second conductive via on the first conductive line and the second conductive line, respectively; and forming a first conductive rail and a second conductive rail extending in a second direction perpendicular to the first direction over the first conductive via and the second conductive via, the first conductive rail and the second conductive rail being electrically connected to the first conductive via and the second conductive via, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
    forming an isolation structure in a substrate;
    forming a first conductive line and a second conductive line in contact with a top surface of the isolation structure, wherein the first conductive line and the second conductive line extend in a first direction substantially parallel to the top surface of the isolation structure;
    depositing a dielectric layer over the first conductive line and the second conductive line;
    forming a first conductive via and a second conductive via on the first conductive line and the second conductive line, respectively;
    forming a first conductive rail and a second conductive rail extending in a second direction perpendicular to the first direction over the first conductive via and the second conductive via, the first conductive rail and the second conductive rail being electrically connected to the first conductive via and the second conductive via, respectively; and
    forming a first-type doping region and a second-type doping region in the substrate prior to forming the isolation structure, wherein the first conductive line and the second conductive line are formed over a portion of the isolation structure over a boundary between the first-type doping region and the second-type doping region.

2. The method according to claim 1, further comprising:
    forming an active region in the substrate; and
    forming a transistor over the active region and free from overlapping the portion of the isolation structure from a top view perspective.

3. The method according to claim 2, wherein forming the transistor comprises:
    forming a gate electrode, a source conductive line, and a source conductive layer at a same layer with the first conductive line and the second conductive line.

4. The method according to claim 1, further comprising:
    forming a well layer in the substrate prior to forming the first-type doping region and the second-type doping region, wherein the boundary between the first-type doping region and the second-type doping region overlaps the well layer.

5. The method according to claim 1, further comprising:
    forming a third conductive line extending in the first direction at a side of the first conductive line opposite to the second conductive line and over the isolation structure.

6. The method according to claim 5, wherein the first conductive line is between the second conductive line and the third conductive line.

7. The method according to claim 5, further comprising:
    forming a third conductive via on the third conductive line, wherein the third conductive via is electrically connected to the second conductive rail.

8. A method of manufacturing a semiconductor structure, comprising:
    forming a first-type doping region and a second-type doping region in a substrate;
    forming an active region and an isolation structure in the substrate, wherein the isolation structure comprises a portion over a boundary between the first-type doping region and the second-type doping region; and
    forming a first conductive line and a second conductive line free from vertically overlapping the active region and in contact with the portion of the isolation structure.

9. The method according to claim 8, wherein the second conductive line vertically overlaps the boundary.

10. The method according to claim 9, further comprising:
    forming a third conductive line at a side of the first conductive line and over the isolation structure, wherein the first conductive line is between the second conductive line and the third conductive line.

11. The method according to claim 10, further comprising:
    forming a conductive rail extending in a direction substantially perpendicular to that of the second conductive line and electrically connected to the second conductive line and the third conductive line.

12. The method according to claim 8, further comprising:
forming a first conductive via and a second conductive via on the first conductive line and the second conductive line, respectively, wherein the second conductive via vertically overlaps the portion of the isolation structure.

13. The method according to claim 12, further comprising:
forming a first conductive rail and a second conductive rail extending over the first conductive via and the second conductive via, respectively, wherein the second conductive rail crosses over the first conductive line and the second conductive line.

14. The method according to claim 8, further comprising:
forming a well layer in the substrate and over the portion of the isolation structure prior to forming the first-type doping region and the second-type doping region.

15. A method of manufacturing a semiconductor structure, comprising:
forming an active region and an isolation structure in a substrate;
forming a first-type doping region and a second-type doping region in the substrate; and
forming a first capacitor over the substrate and free from overlapping the active region from a top view perspective, wherein the first capacitor is over and in contact with a portion of the isolation structure over a boundary between the first-type doping region and the second-type doping region.

16. The method according to claim 15, further comprising:
forming a conductive rail electrically connected to the first capacitor and crossing over the active region.

17. The method according to claim 15, further comprising:
forming a second capacitor over the portion of the isolation structure and free from overlapping the active region from the top view perspective.

18. The method according to claim 17, wherein the second capacitor is in contact with the portion of the isolation structure.

19. The method according to claim 17, wherein forming the first capacitor comprises:
forming a first conductive line and a second conductive line over and in contact with the substrate;
forming a first conductive via and a second conductive via on the first conductive line and the second conductive line, respectively; and
depositing a dielectric layer over the first conductive line and the second conductive line.

20. The method according to claim 19, wherein forming the second capacitor comprises:
forming a third conductive line extending at a side of the first conductive line opposite to the second conductive line prior to depositing the dielectric layer; and
forming a third conductive via on the third conductive line, wherein the first capacitor and the second capacitor share the first conductive line.

* * * * *